United States Patent
Xie et al.

(10) Patent No.: US 10,163,900 B2
(45) Date of Patent: Dec. 25, 2018

(54) INTEGRATION OF VERTICAL FIELD-EFFECT TRANSISTORS AND SADDLE FIN-TYPE FIELD EFFECT TRANSISTORS

(71) Applicant: GLOBALFOUNDRIES Inc., Grand Cayman (KY)

(72) Inventors: Ruilong Xie, Schenectady, NY (US); Min Gyu Sung, Latham, NY (US); Kwan-Yong Lim, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 10 days.

(21) Appl. No.: 15/427,403

(22) Filed: Feb. 8, 2017

(65) Prior Publication Data
US 2018/0226402 A1 Aug. 9, 2018

(51) Int. Cl.
*H01L 27/088* (2006.01)
*H01L 29/06* (2006.01)
(Continued)

(52) U.S. Cl.
CPC .... *H01L 27/0886* (2013.01); *H01L 21/31111* (2013.01); *H01L 21/823431* (2013.01);
(Continued)

(58) Field of Classification Search
CPC ............ H01L 27/0886; H01L 27/0924; H01L 27/1211; H01L 29/41791; H01L 29/66795; H01L 29/785; H01L 29/7855
See application file for complete search history.

(56) References Cited

U.S. PATENT DOCUMENTS 7,189,617 B2  3/2007  Slesazeck et al.
7,498,632 B2  3/2009  Lee
(Continued)

FOREIGN PATENT DOCUMENTS

WO  2005065385 A2  7/2005

OTHER PUBLICATIONS

Ruilong Xie et al., "Integration of Vertical-Transport Transistors and High-Voltage Transistors", U.S. Appl. No. 15/604,932, filed May 25, 2017.
(Continued)

*Primary Examiner* — Jose R Diaz
(74) *Attorney, Agent, or Firm* — Thompson Hine LLP; Francois Pagette

(57) ABSTRACT

Structures for the integration of a vertical field-effect transistor and a saddle fin-type field-effect transistor into an integrated circuit, as well as methods of integrating a vertical field-effect transistor and a saddle fin-type field-effect transistor into an integrated circuit. A trench isolation is formed in a substrate that defines a first device region and a second device region. A first semiconductor fin is formed that projects from the first device region and a second semiconductor fin is formed that projects from the second device region. A vertical field-effect transistor is formed using the first semiconductor fin, and a saddle fin-type field-effect transistor is formed using the second semiconductor fin. A top surface of the trench isolation in the second device region adjacent to the second semiconductor fin is recessed relative to the top surface of the trench isolation in the first device region adjacent to the first semiconductor fin.

7 Claims, 10 Drawing Sheets

(51) Int. Cl.
    *H01L 29/78*     (2006.01)
    *H01L 21/8234*   (2006.01)
    *H01L 21/311*    (2006.01)

(52) U.S. Cl.
    CPC ........... *H01L 21/823468* (2013.01); *H01L 21/823481* (2013.01); *H01L 21/823487* (2013.01); *H01L 29/0649* (2013.01); *H01L 29/7827* (2013.01)

(56) References Cited

U.S. PATENT DOCUMENTS

| | | | |
|---|---|---|---|
| 7,601,583 | B2 | 10/2009 | Jang et al. |
| 8,455,945 | B2 | 6/2013 | Lee et al. |
| 8,647,938 | B1 | 2/2014 | Baars et al. |
| 8,691,649 | B2 | 4/2014 | Park et al. |
| 8,835,262 | B2 * | 9/2014 | Cai ............ H01L 29/785 257/E21.442 |
| 9,589,846 | B1 | 3/2017 | Tsai et al. |
| 10,026,737 | B1 * | 7/2018 | Ching ............ H01L 27/0886 |
| 2002/0173066 | A1 | 11/2002 | Masuoka |
| 2006/0237788 | A1 | 10/2006 | Ishimaru |
| 2009/0273984 | A1 | 11/2009 | Tanzawa |
| 2012/0319201 | A1 | 12/2012 | Sun et al. |
| 2013/0049135 | A1 | 2/2013 | Moriyama |
| 2013/0178031 | A1 | 7/2013 | Ramkumar et al. |
| 2014/0252442 | A1 | 9/2014 | Chuang et al. |
| 2014/0299938 | A1 | 10/2014 | Zhang et al. |
| 2016/0268256 | A1 | 9/2016 | Yang et al. |
| 2017/0025533 | A1 | 1/2017 | Phoa et al. |
| 2017/0062484 | A1 | 3/2017 | Hsu et al. |

OTHER PUBLICATIONS

Ruilong Xie et al., "Integration of Vertical-Transport Transistors and Planar Transistors", U.S. Appl. No. 15/868,199, filed Jan. 11, 2018.
USPTO, Office Action issued in U.S. Appl. No. 15/604,932 dated Jun. 20, 2018.

* cited by examiner

INTEGRATION OF VERTICAL FIELD-EFFECT TRANSISTORS AND SADDLE FIN-TYPE FIELD EFFECT TRANSISTORS

BACKGROUND

The present invention relates to semiconductor device fabrication and integrated circuits and, more specifically, to structures for the integration of a vertical field-effect transistor and a saddle fin-type field-effect transistor into an integrated circuit, as well as methods of integrating a vertical field-effect transistor and a saddle fin-type field-effect transistor into an integrated circuit.

Traditional transistor structures include a source, a drain, a channel situated between the source and drain, and a gate electrode configured to respond to a gate voltage by selectively connecting the source and drain to each other through the channel. Transistor structures are formed on a surface of a semiconductor substrate, which surface may be considered to be contained in a horizontal plane. Transistor structures can be broadly categorized based upon the orientation of the channel relative to the surface of the semiconductor substrate.

Planar transistors constitute a category of transistor structures in which the channels are oriented parallel to the substrate surface. Vertical transistors represent a different category of transistor structures in which the channels are aligned vertical to the substrate surface. Because the gated current between the source and drain is directed through the channel, different types of vertical transistors, namely fin-type field-effect transistors (FinFETs), and vertical field-effect transistors, can also be distinguished from each other based upon the direction of current flow. A FinFET has a horizontal channel in which the direction of the gated current flow between the source and drain of a FinFET-type vertical transistor is generally parallel (i.e., horizontal) to the substrate surface. In contrast, the direction of the gated current flow in the vertical channel between the source and drain in a vertical field-effect transistor is generally perpendicular (i.e., vertical) to the substrate surface.

Improved structures and fabrication methods are needed that integrate a vertical field-effect transistor and a saddle fin-type field-effect transistor in an integrated circuit.

SUMMARY

According to an embodiment, a structure includes trench isolation in a substrate that defines a first device region and a second device region, a saddle fin-type field-effect transistor including a first semiconductor fin projecting from the first device region and a first gate electrode, and a vertical field-effect transistor including a second semiconductor fin projecting from the second device region and a second gate electrode associated with the second semiconductor fin. The first semiconductor fin has a top surface and a channel recess extending from the top surface into the first semiconductor fin. The first gate electrode is positioned within the channel recess and on the trench isolation. A top surface of the trench isolation adjacent to the first semiconductor fin in the first device region is recessed relative to a top surface of the trench isolation adjacent to the second semiconductor fin in the second device region.

According to another embodiment, a method includes forming trench isolation in a substrate that defines a first device region and a second device region, forming a first semiconductor fin projecting from the first device region and a second semiconductor fin projecting from the second device region, forming a vertical field-effect transistor using the first semiconductor fin, and forming a saddle fin-type field-effect transistor using the second semiconductor fin. A top surface of the trench isolation in the second device region adjacent to the second semiconductor fin is recessed relative to the top surface of the trench isolation in the first device region adjacent to the first semiconductor fin.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
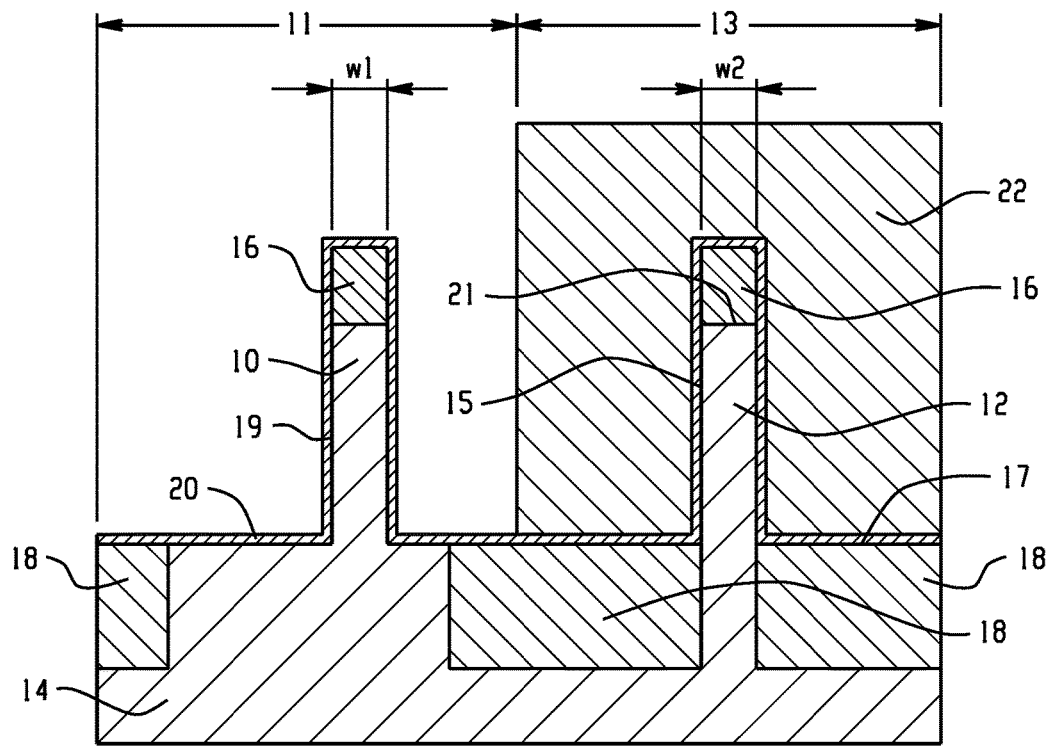
FIGS. 1-4 are cross-sectional views of a structure at successive subsequent fabrication stages of a processing method in accordance with embodiments of the invention.

With reference to FIG. 1 and in accordance with an embodiment of the invention, fins 10, 12 may be located on a substrate 14, which may be a bulk silicon substrate or a silicon device layer of a semiconductor-on-insulator (SOI) substrate. The fins 10, 12 may be three-dimensional bodies comprised of a semiconductor material, such as silicon, and project in a vertical direction relative to the top surface of the substrate 14. The fins 10, 12, which are arranged in parallel rows, may be formed by patterning an epitaxial layer of intrinsic semiconductor material using photolithography and etching processes, such as a sidewall imaging transfer (SIT) process. Each of the fins 10, 12 may be capped by a section of a hardmask layer 16 composed of, for example, silicon nitride ($Si_3N_4$), which is used during fin patterning.

Fin 10 has sidewalls 19, and fin 12 has sidewalls 15 and a top surface 21. In an embodiment, the fin 10 has a width, w1, between sidewalls 19 and fin 12 has a width, w2, between the sidewalls 15. The width of fin 10 may be the same as the width of fin 12. Fin 10 and other fins similar to fin 10 may be formed with a given pitch, fin 12 and other fins similar to fin 12 may be formed with a given pitch, and the given pitches may be equal. The equal pitches and the equal widths may promote efficient photolithography. In an embodiment, the fins 10, 12 are concurrently formed by the same photolithography and etching process.

Trench isolation 18 is formed in the substrate 14, and defines the size, geometrical shape, and outer boundary for a device region 11 associated with fin 10 and a device region 13 associated with fin 12. The trench isolation 18 may be comprised of a dielectric material, such as an oxide of silicon (e.g., $SiO_2$) deposited by chemical vapor deposition (CVD). A vertical field-effect transistor (VFET) may be formed in device region 11 using fin 10, and a saddle fin-type field-effect transistor (FinFET) may be formed in device region 13 using fin 12. The VFET may function as a short-channel device, and the FinFET may function as a long-channel device in an integrated circuit fabricated on a chip using the substrate 14.

A conformal liner layer 20 is applied in both device regions 11, 13, and may be composed of a dielectric material, such as silicon nitride ($Si_3N_4$), that is deposited by CVD. A block mask 22 composed of an organic planarization layer (OPL) material may be applied by a spin-coating process and patterned to define an opening that exposes fin 10 and device region 11. The conformal liner layer 20 on fin 12 and device region 13 is covered by the block mask 22.

Figure 2:
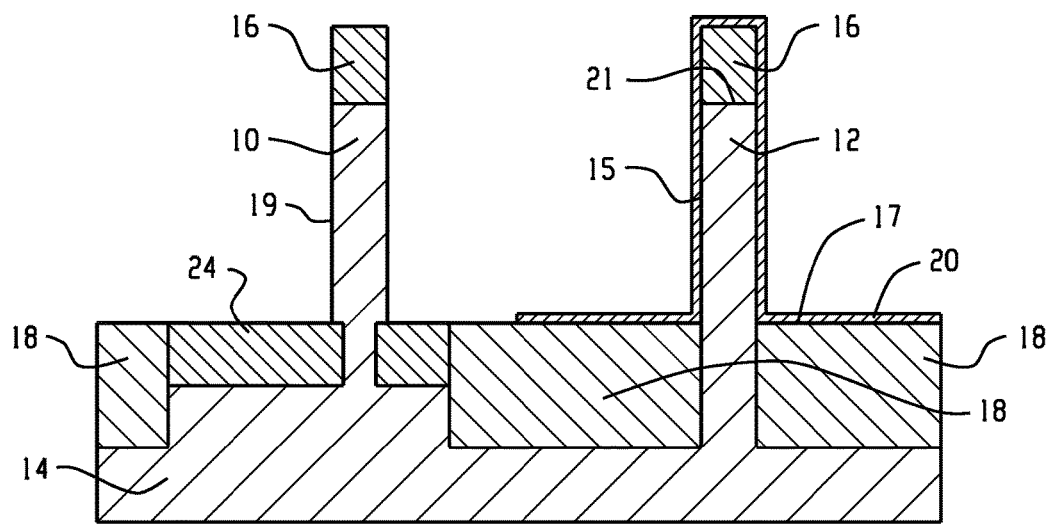

With reference to FIG. 2 in which like reference numerals refer to like features in FIG. 1 and at a subsequent fabrication stage, the conformal liner layer 20 is removed from fin 10 and device region 11 by an etching process. The block mask 22, which protects the section of the conformal liner layer 20 covering fin 12 and device region 13 during the etching process, is subsequently removed. A bottom source/drain region 24 of a vertical field-effect transistor is formed in the section of the substrate 14 beneath the fin 10. As used herein, the term "source/drain region" means a doped region of semiconductor material that can function as either a source or a drain of a field-effect transistor. The bottom source/drain region 24 may be formed by recessing the substrate 14 in the device region 11 adjacent to the fin 10 and epitaxially growing a doped semiconductor material in the recess. Alternatively, the substrate 14 in the device region 11 adjacent to the fin 10 may be ion implanted with a dopant to form the bottom source/drain region 24. In an embodiment, the bottom source/drain region 24 may include a concentration of an n-type dopant from Group V of the Periodic Table (e.g., phosphorus (P) or arsenic (As)) that is effective to impart n-type electrical conductivity to the constituent semiconductor material.

Figure 3:
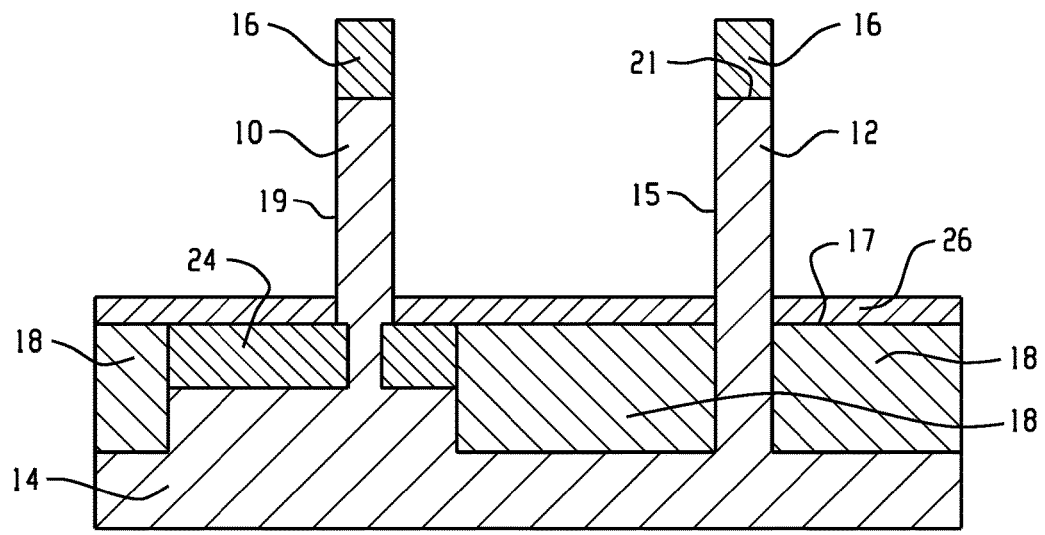

With reference to FIG. 3 in which like reference numerals refer to like features in FIG. 2 and at a subsequent fabrication stage, the conformal liner layer 20 is removed from the fin 12 and device region 13 with an etching process, and the block mask 22 is removed. A bottom spacer layer 26 is formed on the bottom source/drain region 24 and on the trench isolation 18 in device region 13. The bottom spacer layer 26 may be composed of a dielectric material, such as silicon boron carbide nitride (SiBCN), that is deposited by atomic layer deposition (ALD), plasma-enhanced atomic layer deposition (PEALD), CVD, plasma-enhanced chemical vapor deposition (PECVD), or another deposition technique. The fins 10, 12 penetrate through the thickness of the spacer layer 26 with only a fraction of their respective lengths overlapped by the bottom spacer layer 26 at their respective bases.

Figure 4:
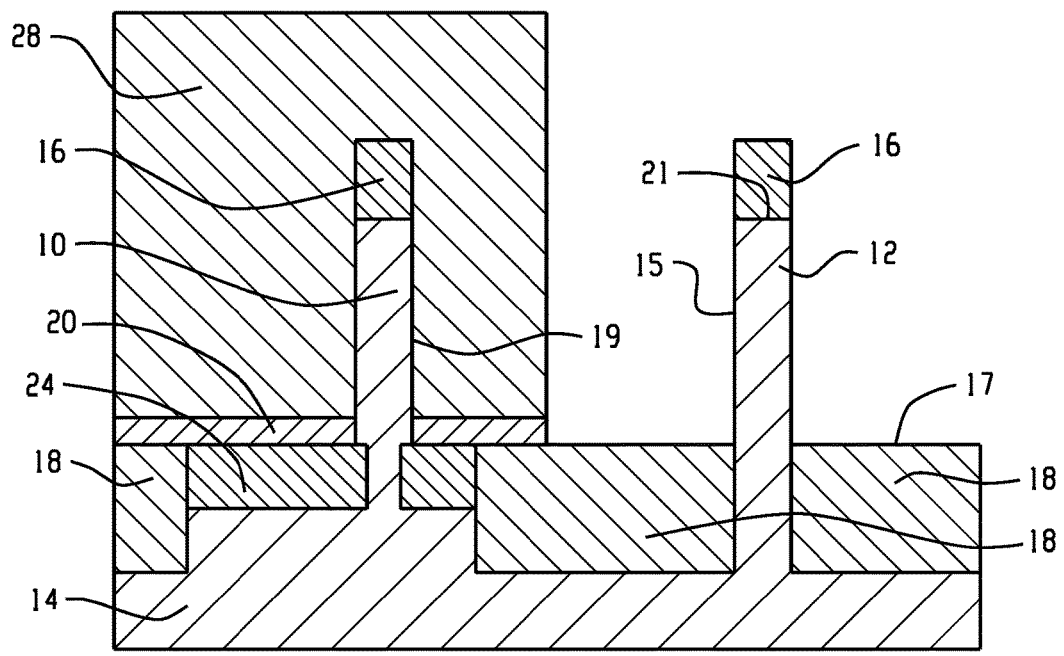

With reference to FIG. 4 in which like reference numerals refer to like features in FIG. 3 and at a subsequent fabrication stage, a block mask 28 composed of an OPL material may be applied by a spin-coating process and patterned to expose fin 12 and device region 13. Fin 10 and device region 11 are covered by the block mask 28. The bottom spacer layer 26 is removed from device region 13 using an etching process, such as a reactive ion etching process. The bottom spacer layer 26 is retained in device region 11.

Figure 5:
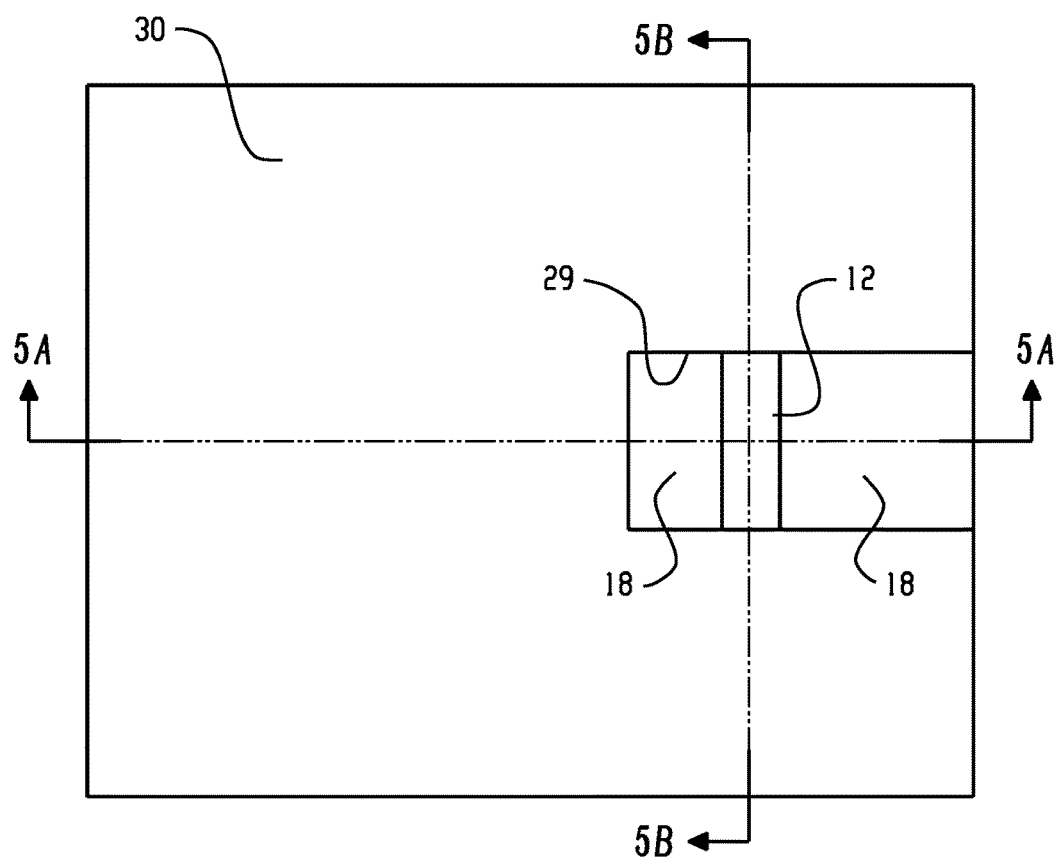
FIG. 5 is a top view of the structure at a fabrication stage subsequent to FIG. 4.
Figure 5A:
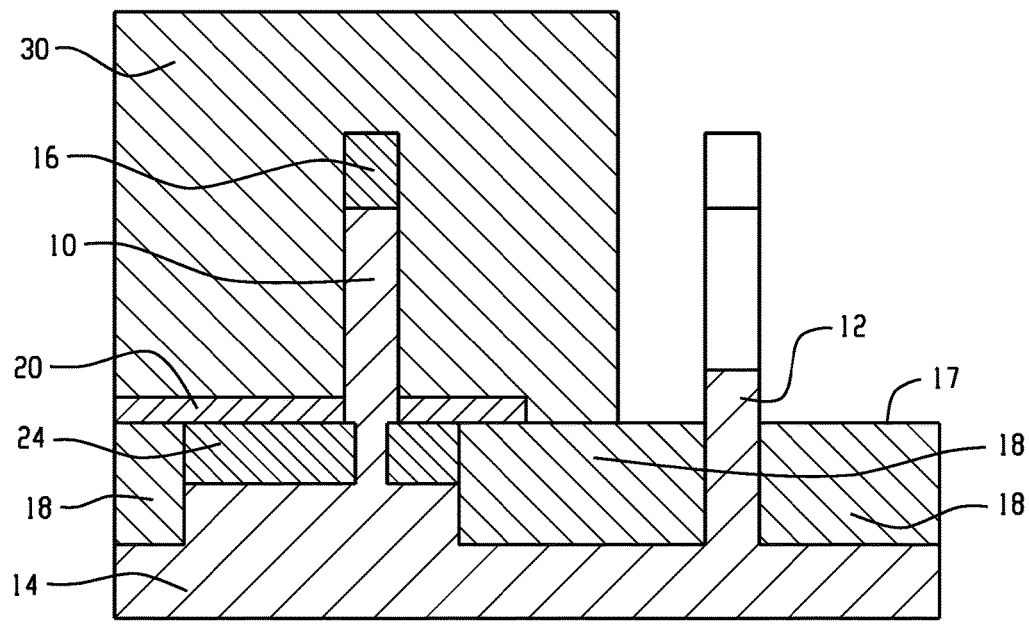
FIG. 5A is a cross-sectional view similar to FIG. 4 taken generally along line 5A-5A in FIG. 5.
Figure 5B:
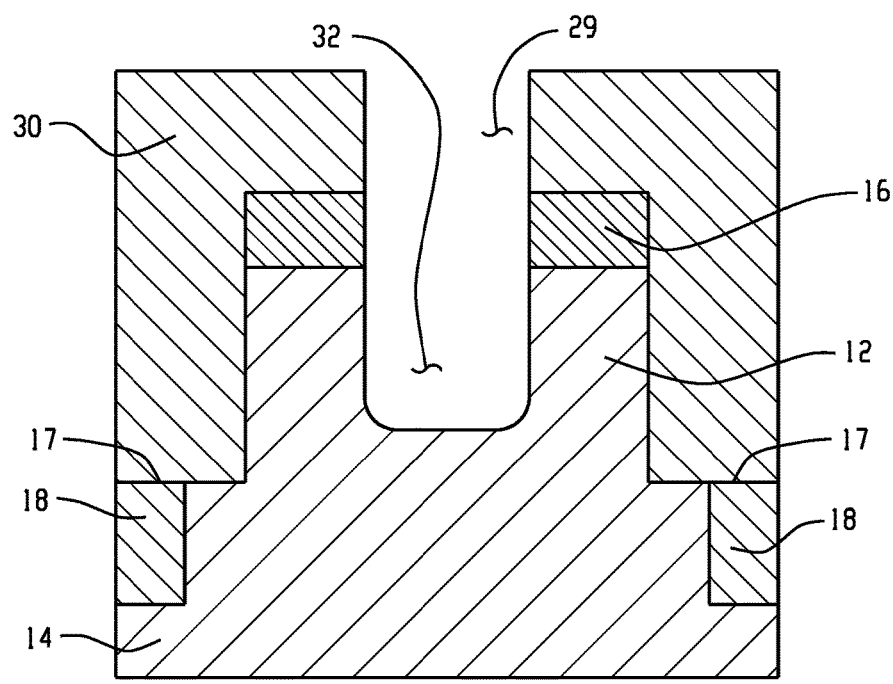
FIG. 5B is a cross-sectional view taken generally along line 5B-5B in FIG. 5.

With reference to FIGS. 5, 5A, 5B in which like reference numerals refer to like features in FIG. 4 and at a subsequent fabrication stage, a block mask 30 composed of an OPL material may be applied by a spin-coating process and patterned to define an opening 29 that exposes a central section of fin 12 and the trench isolation 18 on opposite sides of the central section of fin 12. Fin 10 and device region 11 are masked by the block mask 28, and sections of fin 12 and device region 13 adjacent to each side of the exposed central section of fin 12 are masked. The patterned block mask 30 is used as an etch mask for an etching process, such as reactive-ion etching (ME), that directionally removes an unmasked section of the fin 12, as well as a section of the overlying hardmask layer 16, at the location of the opening 29 in the patterned block mask 30 to form a channel recess 32 in the fin 12. The channel recess 32 extends vertically from the top surface 21 of the fin 12 into the body of the fin 12. The etching process may be conducted in a single etching step with a given etch chemistry or in multiple etching steps with different etch chemistries. The block masks 28, 30 are stripped after the channel recess 32 is etched in fin 12.

Figure 6A:
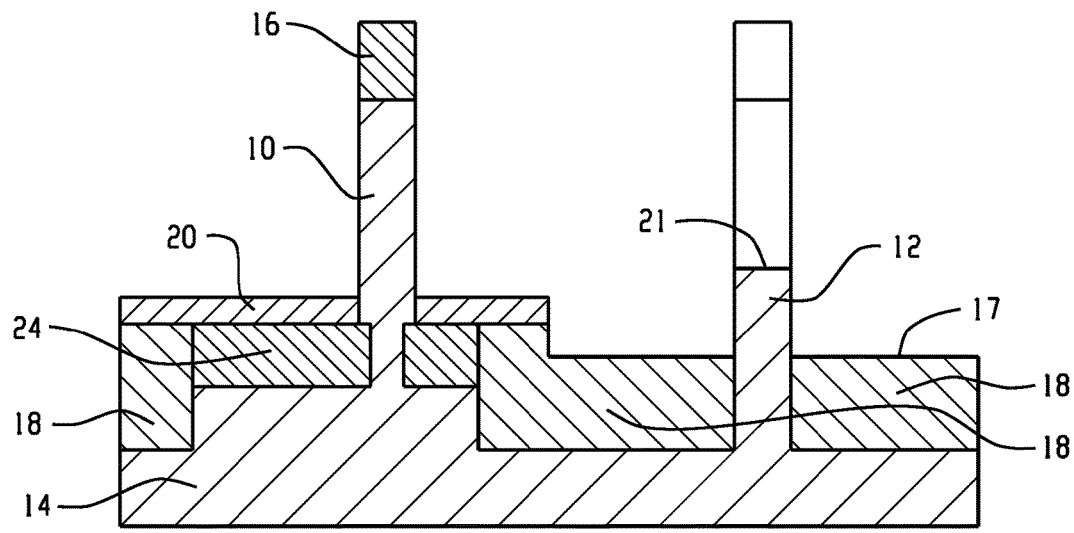
FIGS. 6A and 6B are respective cross-sectional views of the structure at a fabrication stage subsequent to FIGS. 5A and 5B.
Figure 6B:
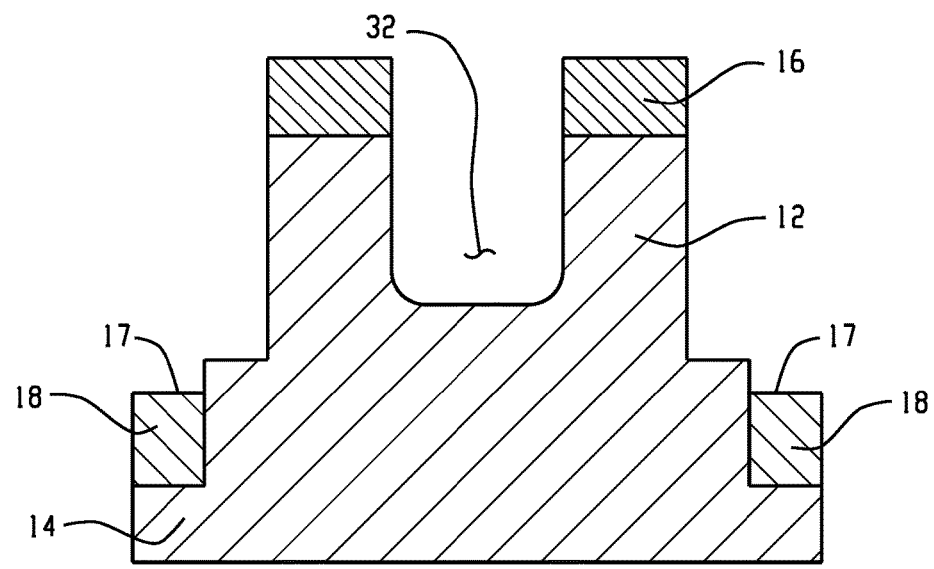

With reference to FIGS. 6A, 6B in which like reference numerals refer to like features in FIGS. 5A, 5B and at a subsequent fabrication stage, an etch-back process may be used to recess the top surface 17 of the trench isolation 18 relative to the fin 12 in device region 13. The etch-back process may be conducted in a single etching step with a given etch chemistry or in multiple etching steps with different etch chemistries that remove the dielectric material of the trench isolation 18 selective to the materials of the bottom spacer layer 26, the fins 10, 12, and the hardmask layer 16. The etch-back process effectively increases the height of active section of the fin 12 located above the top surface 17 of the trench isolation 18. The top surface 17 of the trench isolation 18 in device region 11 near fin 10 is not recessed due to the masking by the bottom spacer layer 26. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

Figure 7A:
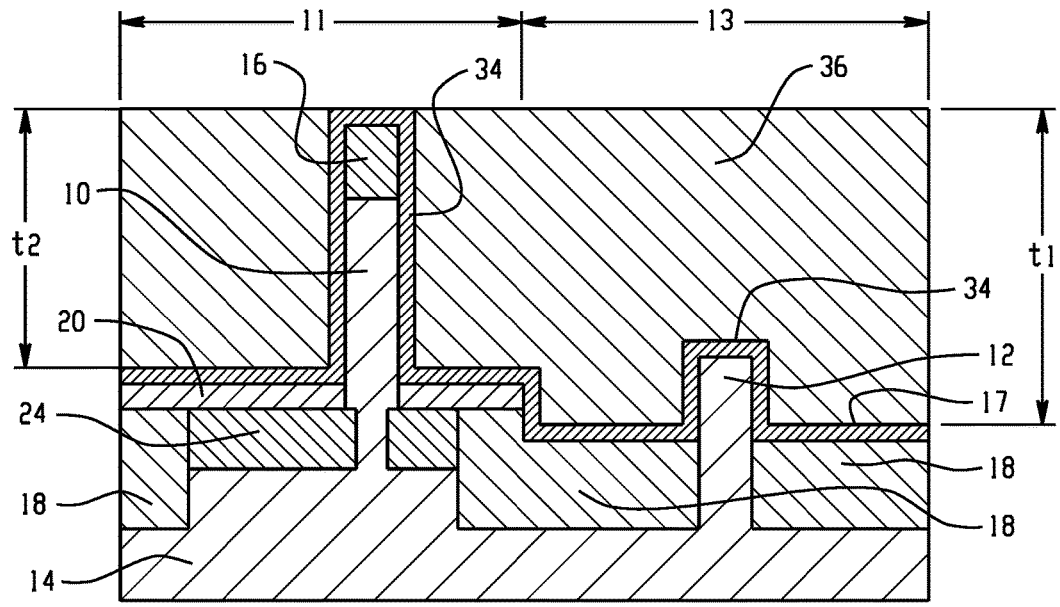
FIGS. 7A and 7B are respective cross-sectional views of the structure at a fabrication stage subsequent to FIGS. 6A and 6B.
Figure 7B:
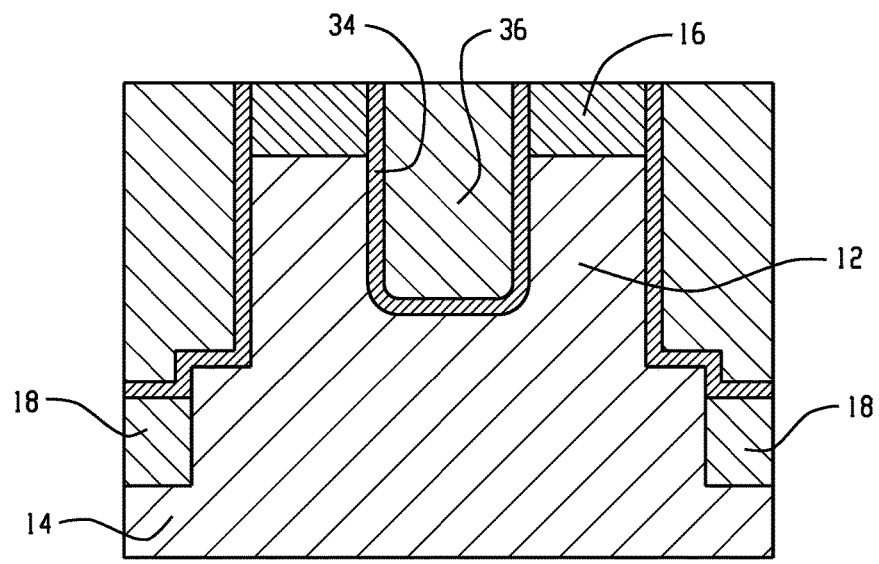

With reference to FIGS. 7A, 7B in which like reference numerals refer to like features in FIGS. 6A, 6B and at a subsequent fabrication stage, a gate dielectric 34 is formed on the fins 10, 12, the top surface of the bottom spacer layer 26 in device region 11, and the top surface of the device region 13 adjacent to fin 12. The gate dielectric 34 may be comprised of an electrical insulator with a dielectric constant (e.g., a permittivity) characteristic of a dielectric material. For example, the gate dielectric 34 may be comprised of a high-k dielectric material such as hafnium oxide, that is deposited by CVD, ALD, etc. A metal gate layer 36 is formed after the gate dielectric 34 is formed. The metal gate layer 36 may be comprised of one or more metals, such as titanium aluminum carbide (TiAlC), titanium nitride (TiN), tungsten (W), etc., that is deposited by physical vapor deposition (PVD), ALD, CVD, or another deposition process.

The section of the metal gate layer 36 in device region 13 is thicker than the section of the metal gate layer 36 in device region 11. Specifically, the section of the metal gate layer 36 in device region 13 has a thickness, t1, and the section of the metal gate layer 36 in device region 11 has a thickness, t2, that is greater than thickness, t1. The difference in thickness for the metal gate layer 36 in the different device regions 11, 13 originates from the recessing of the top surface 17 of the trench isolation 18 relative to the fin 12 in device region 13 before the metal gate layer 36 is formed.

Figure 8A:
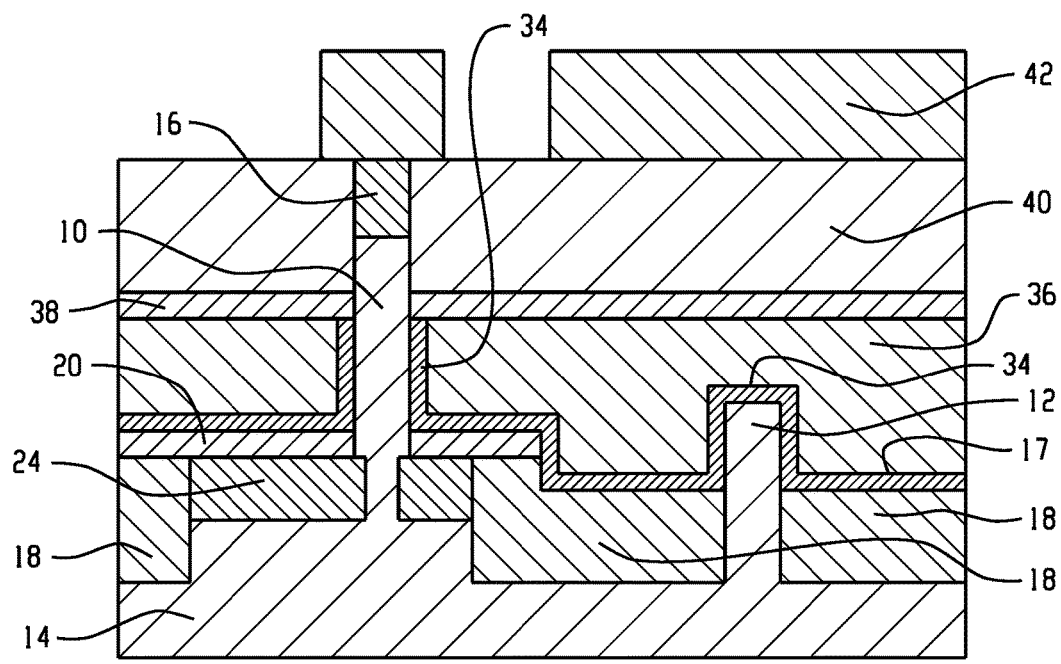
FIGS. 8A and 8B are respective cross-sectional views of the structure at a fabrication stage subsequent to FIGS. 7A and 7B.
Figure 8B:
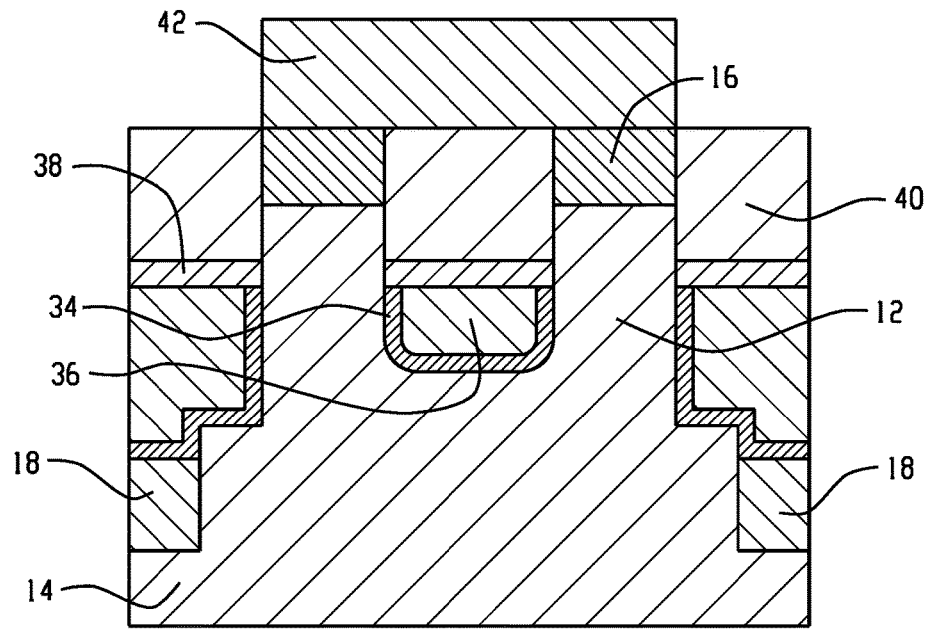

With reference to FIGS. 8A, 8B in which like reference numerals refer to like features in FIGS. 7A, 7B and at a subsequent fabrication stage, the gate dielectric layer 34 and the metal gate layer 36 are recessed relative to the fins 10, 12 with one or more etching processes. A top spacer layer 38 is formed on the recessed top surface of the metal gate layer 36. The top spacer layer 38 may be comprised of a dielectric material, such as silicon boron carbide nitride (SiBCN) or silicon nitride ($Si_3N_4$), that is deposited by ALD, PEALD, CVD, PECVD, or another deposition technique. The thickness differential between the section of the metal gate layer 36 in device region 11 and the section of the metal gate layer 36 in device region 13 is maintained following the recessing.

A gap-fill layer 40 is formed on the top surface of the top spacer layer 38. The gap-fill layer 40 may be composed of a dielectric material, such as silicon dioxide ($SiO_2$), deposited by CVD. The gap-fill layer 40 may be formed by depositing a layer of its constituent dielectric material, and planarizing the layer with, for example, chemical mechanical polishing (CMP) to be coplanar with the hardmask layer 16. An etch mask 42 composed of an OPL material may be applied by a spin-coating process and patterned to define features at locations for the formation of respective gate electrodes associated with the fins 10, 12.

Figure 9A:
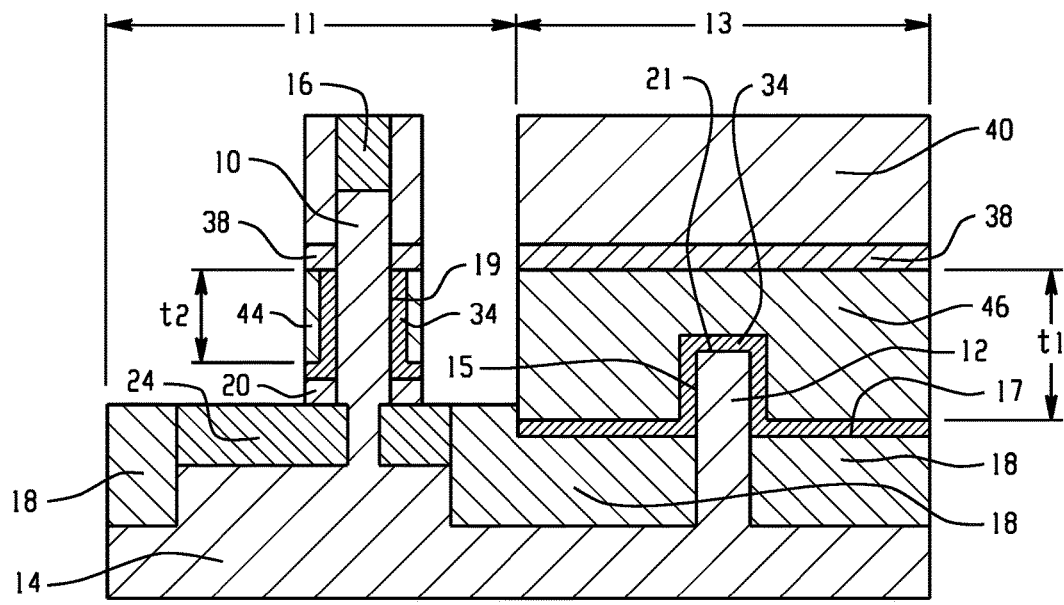
FIGS. 9A and 9B are respective cross-sectional views of the structure at a fabrication stage subsequent to FIGS. 8A and 8B.
Figure 9B:
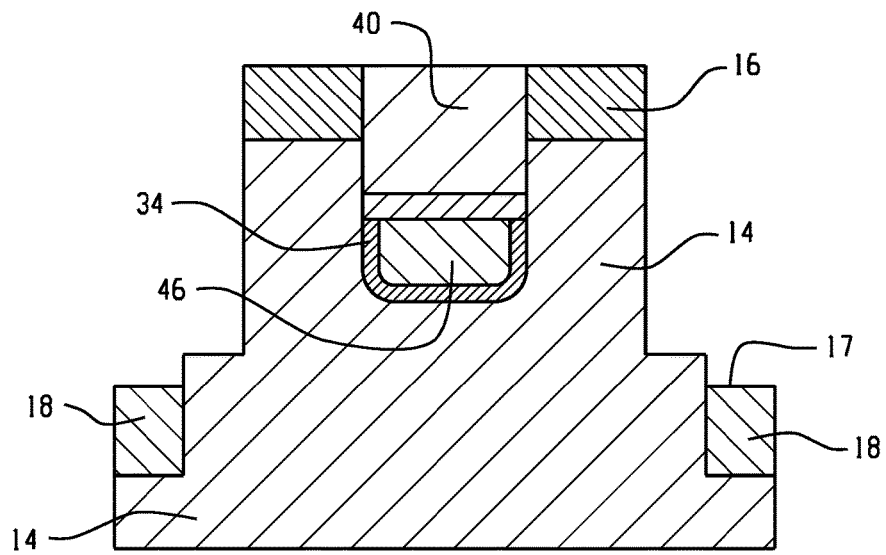

With reference to FIGS. 9A, 9B in which like reference numerals refer to like features in FIGS. 8A, 8B and at a subsequent fabrication stage, the top spacer layer 38, the metal gate layer 36, and the bottom spacer layer 26 are patterned with etching, such as RIE. The patterning of the metal gate layer 36 forms a gate electrode 44 that is associated with fin 10 in device region 11 and a gate electrode 46 that is associated with fin 12 in device region 13. The bottom spacer layer 26 may be confined to be located only on the bottom source/drain region 24 after being patterned. The etching process may be conducted in a single etching step with a given etch chemistry or in multiple etching steps with different etch chemistries specific to different materials. The etch mask 42 is stripped after the gate electrodes 44, 46 are formed by the patterning.

The gate electrode 46 formed in device region 13 has a height equal to the reduced thickness, t1, of the recessed metal gate layer 36 in device region 13. The gate electrode 44 formed in device region 11 has a height equal to the reduced thickness, t2, of the recessed metal gate layer 36 in device region 11. Due to the difference in thickness, the height of the gate electrode 46 relative to the top surface 17 of the trench isolation 18 is greater than the height of the gate electrode 44. The difference in height arises from the selective recessing of the top surface 17 of the trench isolation 18 relative to the fin 12 in device region 13 in advance of the formation of the metal gate layer 36. After patterning, the gate electrode 44 may be spaced from the gate electrode 46 by a gap that is subsequently filled by an electrical insulator. Alternatively, the gate electrode 44 may be connected with the gate electrode 46 by a bridging section of the metal gate layer 36.

Figure 10A:
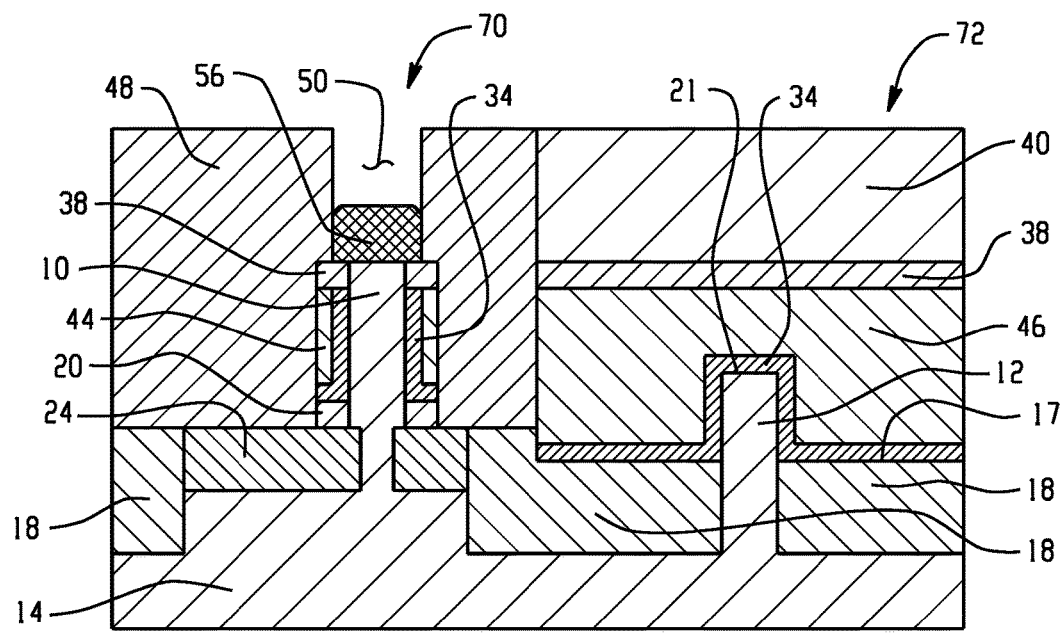
FIGS. 10A and 10B are respective cross-sectional views of the structure at a fabrication stage subsequent to FIGS. 9A and 9B.
Figure 10B:
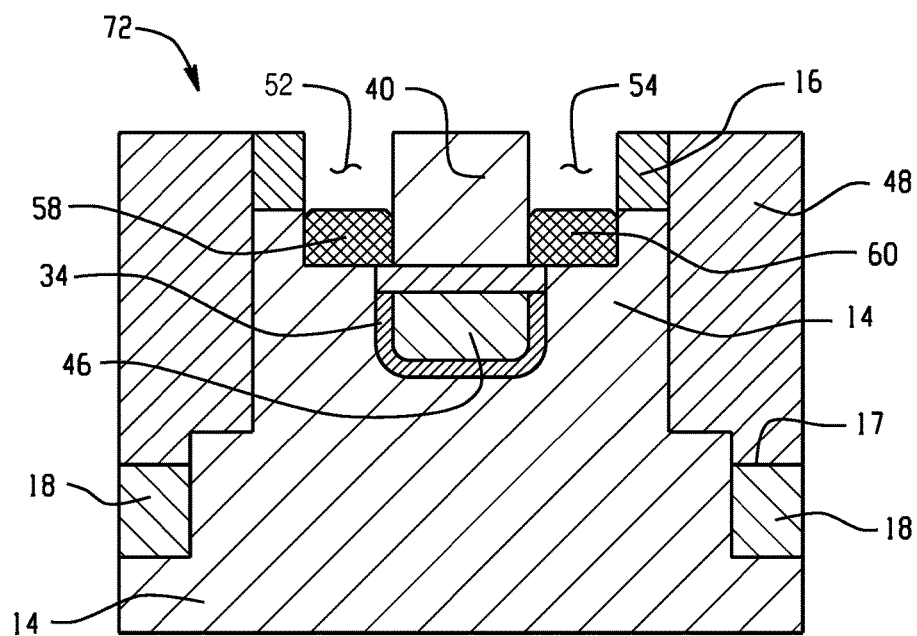

With reference to FIGS. 10A, 10B in which like reference numerals refer to like features in FIGS. 9A, 9B and at a subsequent fabrication stage, a gap-fill layer 48 is applied to fill the open volume created by the patterning of the metal gate layer 36 that forms gate electrodes 44, 46. The gap-fill layer 48 may be composed of a dielectric material, such as silicon dioxide ($SiO_2$), that is deposited by CVD. The gap-fill layer 48 may be formed by depositing a layer of its constituent dielectric material, and planarizing the layer with, for example, CMP to be coplanar with the hardmask layer 16.

Openings 50, 52, 54 are formed in the gap-fill layer 48 by etching, such as RIE. The opening 50 is aligned with the top surface of the fin 10, and the section of the hardmask 16 layer on fin 10 is removed. The openings 52, 54 are aligned with the top surface of the fin 12, and are located on opposite sides of the gate electrode 46. The section of the hardmask 16 layer on fin 12 is removed at the location of openings 52, 54, and the openings 52, 54 are extended to a shallow penetration depth into the fin 12 stopping at the depth of the top spacer layer 38.

A top source/drain region 56 of a vertical field-effect transistor 70 is formed on the top surface of the fin 10 inside of the opening 50. A source/drain region 58 of a saddle fin-type field-effect transistor 72 is formed on the top surface 21 of the fin 12 inside of the opening 52, and a source/drain region 60 of the saddle fin-type field-effect transistor 72 is formed on the top surface 21 of the fin 12 inside of the opening 54. The source/drain region 58 is separated from the source/drain region 60 by a section of the gap-fill layer 48, which provides electrical insulation and isolation. A vertical channel region is defined in a portion of the fin 10 overlapped by the gate electrode 44 vertically between the bottom source/drain region 24 and the top source/drain region 56. A channel region is also defined in a portion of the fin 12 between the source/drain region 58 and the source/drain region 60.

The semiconductor material constituting the source/drain region 56 is doped to have the same conductivity type as the bottom source/drain region 24. The semiconductor material constituting source/drain regions 58, 60 are doped to have the same type of electrical conductivity. The source/drain regions 56, 58, 60 may be sections of an epitaxial layer of semiconductor material formed by an epitaxial growth process with in-situ doping, and may include a concentration of an n-type dopant from Group V of the Periodic Table (e.g., phosphorus (P) or arsenic (As)) that is effective to impart n-type electrical conductivity to the constituent semiconductor material. In an embodiment, the source/drain regions 56, 58, 60 may be formed by a selective epitaxial growth (SEG) process in which semiconductor material nucleates for epitaxial growth on semiconductor surfaces such as the fin surfaces, but does not nucleate for epitaxial growth from insulator surfaces.

Figure 11A:
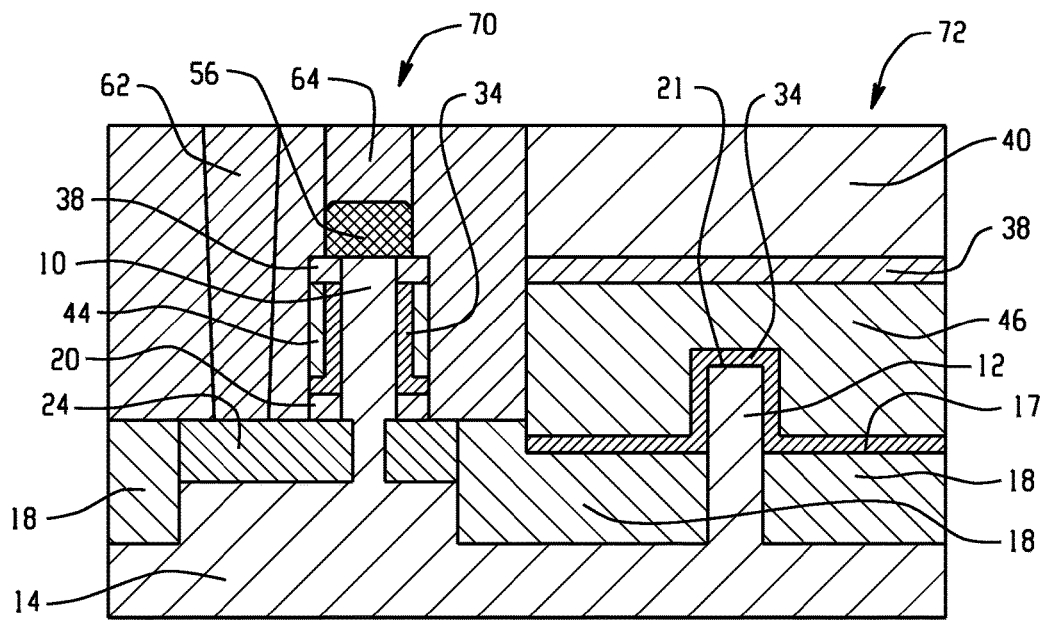
FIGS. 11A and 11B are respective cross-sectional views of the structure at a fabrication stage subsequent to FIGS. 10A and 10B.
Figure 11B:
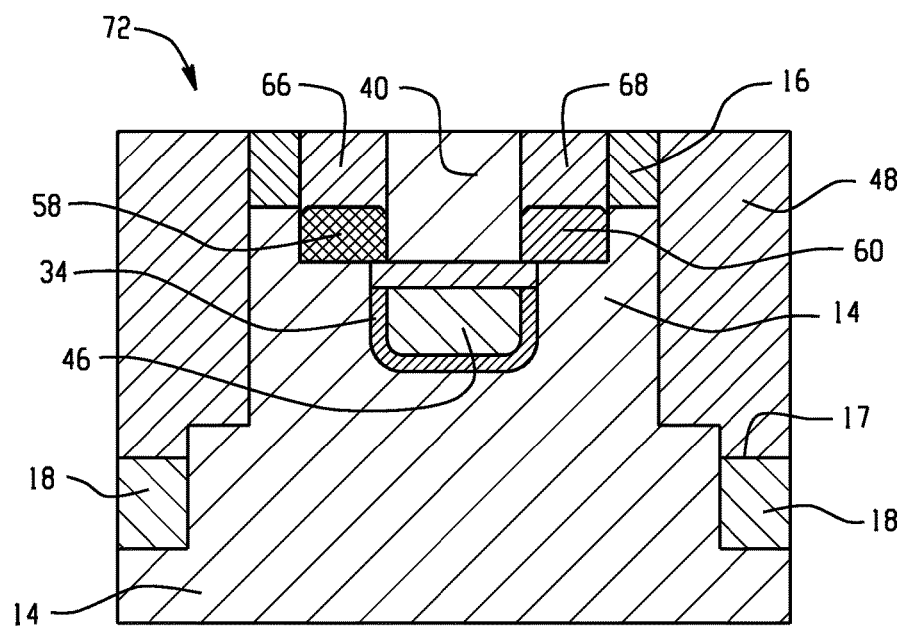

With reference to FIGS. 11A, 11B in which like reference numerals refer to like features in FIGS. 10A, 10B and at a subsequent fabrication stage, middle-of-line (MOL) processing follows to define a local interconnect structure. MOL processing may include deposition of a dielectric material to fill open space inside the openings 50, 52, 54 that is not filled by the source/drain regions 56, 58, 60 and formation of contacts 62, 64, 66, 68. The contacts 62, 64, 66, 68 may be composed of a conductor, such as tungsten (W), and may be clad with a conductive liner (e.g., titanium nitride (TiN)). The contacts 62, 64 for the vertical field-effect transistor 70 may be concurrently formed by the same MOL processing as the contacts 66, 68 for the saddle fin-type field-effect transistor 72.

Contact 62 extends through the dielectric material to contact the bottom source/drain region 24 of the vertical field-effect transistor 70, and contact 64 extends through the dielectric material to contact the top source/drain region 56 of the vertical field-effect transistor 70. Contact 66 extends through the dielectric material to contact the source/drain region 58 of the saddle fin-type field-effect transistor 72, and contact 68 extends through the dielectric material to contact the source/drain region 60 of the saddle fin-type field-effect transistor 72.

Back-end-of-line (BEOL) processing follows, which includes formation of dielectric layers, via plugs, and wiring for an interconnect structure coupled by the local interconnect structure with the vertical field-effect transistor 70 and the saddle fin-type field-effect transistor 72, as well as other similar contacts for additional device structures that replicate the vertical field-effect transistor 70 and the saddle fin-type field-effect transistor 72.

In accordance with embodiments of the invention, the vertical field-effect transistor 70 and the saddle fin-type field-effect transistor 72 are integrated into the same integrated circuit. Several processes are shared when fabricating the vertical field-effect transistor 70 and the saddle fin-type field-effect transistor 72. The saddle fin-type field-effect transistor 72 provides a long-channel device having width and length long enough so that edge effects from the sides of the fin 12 can be neglected.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The terms "horizontal" and "lateral" as used herein are defined as a plane parallel to a conventional plane of a semiconductor substrate, regardless of its actual three-dimensional spatial orientation. The terms "vertical" and "normal" refer to a direction perpendicular to the horizontal, as just defined. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure fabricated using a substrate, the structure comprising:
    trench isolation in the substrate that defines a first device region and a second device region;
    a saddle fin-type field-effect transistor including a first semiconductor fin projecting from the first device region and a first gate electrode, the first semiconductor fin having a top surface and a channel recess extending from the top surface into the first semiconductor fin, and the first gate electrode positioned within the channel recess and on the trench isolation; and
    a vertical field-effect transistor including a second semiconductor fin projecting from the second device region and a second gate electrode associated with the second semiconductor fin,
    wherein the trench isolation has a top surface, and the top surface of the trench isolation adjacent to the first semiconductor fin in the first device region is recessed relative to the top surface of the trench isolation adjacent to the second semiconductor fin in the second device region.

2. The structure of claim 1 wherein the vertical field-effect transistor includes a first source/drain region and a second source/drain region, and the second gate electrode is arranged in a vertical direction relative to the top surface of the trench isolation between the first source/drain region and the second source/drain region.

3. The structure of claim 2 wherein the vertical field-effect transistor includes a spacer layer between the second gate electrode and the first source/drain region, and the first device region is free of the spacer layer.

4. The structure of claim 1 wherein the vertical field-effect transistor includes a spacer layer on the second device region adjacent to the first semiconductor fin, and the top surface of the trench isolation in the first device region is free of the spacer layer.

5. The structure of claim 4 wherein the first semiconductor fin includes a sidewall, and the first gate electrode of the saddle fin-type field-effect transistor extends from the channel recess along the sidewall of the first semiconductor fin to the top surface of the trench isolation.

6. The structure of claim 1 wherein the first semiconductor fin and the second semiconductor fin have equal widths.

7. The structure of claim 1 wherein the first gate electrode of the saddle fin-type field-effect transistor positioned on the trench isolation has a first height, the second gate electrode of the vertical field-effect transistor has a second height, and the first height is greater than the second height.

\* \* \* \* \*